(12) United States Patent
Somei (10) Patent No.: US 7,378,599 B2
(45) Date of Patent: May 27, 2008

(54) PRINTED CIRCUIT BOARD, RADIO WAVE RECEIVING CONVERTER, AND ANTENNA DEVICE

(75) Inventor: Junichi Somei, Nara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 189 days.

(21) Appl. No.: 10/338,720

(22) Filed: Jan. 9, 2003

(65) Prior Publication Data

US 2003/0128532 A1    Jul. 10, 2003

(30) Foreign Application Priority Data

Jan. 10, 2002    (JP) .............................. 2002-003566

(51) Int. Cl.
*H01R 12/04*    (2006.01)
*H05K 1/11*    (2006.01)

(52) U.S. Cl. ...................... 174/262; 174/255; 361/792

(58) Field of Classification Search ................ 174/255, 174/262–266; 361/792–795
See application file for complete search history.

(56) References Cited

U.S. PATENT DOCUMENTS

| | | | | |
|---|---|---|---|---|
| 5,578,796 | A * | 11/1996 | Bhatt et al. .................. | 174/260 |
| 5,675,299 | A * | 10/1997 | Suski ............................ | 333/1 |
| 5,828,555 | A * | 10/1998 | Itoh ............................. | 361/784 |
| 5,982,256 | A | 11/1999 | Uchimura et al. | |
| 6,023,211 | A * | 2/2000 | Somei ......................... | 333/246 |
| 6,107,897 | A * | 8/2000 | Muhlhauser et al. ......... | 333/135 |
| 6,184,477 | B1 * | 2/2001 | Tanahashi ................... | 174/261 |
| 6,184,478 | B1 * | 2/2001 | Imano et al. ................ | 174/261 |
| 6,235,994 | B1 * | 5/2001 | Chamberlin et al. ........ | 174/252 |
| 6,303,871 | B1 * | 10/2001 | Zu et al. ...................... | 174/250 |
| 6,329,603 | B1 * | 12/2001 | Japp et al. .................. | 174/255 |
| 6,407,343 | B1 * | 6/2002 | Tanaka ....................... | 174/261 |
| 6,445,260 | B1 | 9/2002 | Miyazaki et al. | |
| 6,613,413 | B1 * | 9/2003 | Japp et al. .................. | 428/131 |
| 6,613,986 | B1 * | 9/2003 | Hirose et al. ............... | 174/255 |
| 6,696,906 | B1 * | 2/2004 | deBlanc et al. ............. | 333/238 |
| 6,977,345 | B2 * | 12/2005 | Budell et al. ............... | 174/250 |

FOREIGN PATENT DOCUMENTS

| | | |
|---|---|---|
| JP | 59-83070 U | 6/1984 |
| JP | 61-024295 A | 2/1986 |
| JP | 61-290794 A | 12/1986 |
| JP | 01-168093 A | 7/1989 |
| JP | 01-196198 A | 8/1989 |
| JP | 01-3000590 A | 12/1989 |
| JP | 6-53711 A | 2/1994 |
| JP | 6-232562 A | 8/1994 |
| JP | 9-46102 A | 2/1997 |
| JP | 09-199814 A | 7/1997 |
| JP | 09-260795 A | 10/1997 |

(Continued)

*Primary Examiner*—Jeremy C Norris
(74) *Attorney, Agent, or Firm*—Birch, Stewart, Kolasch & Birch, LLP (57) ABSTRACT

A printed circuit board has a substrate formed of an insulator, a strip line provided on a front surface of the substrate, and a ground metal layer provided on a rear surface of the substrate. An opening is provided in the ground metal layer to reach the substrate. A radio wave receiving converter and an antenna device each include the printed circuit board.

13 Claims, 10 Drawing Sheets

FOREIGN PATENT DOCUMENTS

| | | |
|---|---|---|
| JP | 11-274704 A | 10/1999 |
| JP | 2000-216603 A | 8/2000 |
| JP | 2000216509 | 8/2000 |
| JP | 2001-102696 A | 4/2001 |
| JP | 2001-217603 A | 8/2001 |

* cited by examiner

PRINTED CIRCUIT BOARD, RADIO WAVE RECEIVING CONVERTER, AND ANTENNA DEVICE

BACKGROUND OF THE INVENTION

1. Field of the Invention

The present invention relates to printed circuit boards, radio wave receiving converters and antenna devices. More particularly, the present invention relates to a structure of printed circuit board suffering less bowing after heat treatment for reflow or the like, and a radio wave receiving converter and an antenna device each provided with the relevant printed circuit board.

2. Description of the Background Art

Conventionally, a printed circuit board having a wiring pattern formed on a substrate comprised of an insulator is widely known. An example of such a printed circuit board is a high-frequency circuit board. A microstrip line and a coplanar line are often used as lines formed on the high-frequency circuit board.

A substrate portion on which, e.g., a microstrip line is formed (hereinafter, referred to as the "microstrip substrate") consists of a component surface (the surface on which a transmission line is formed) and a ground surface.

Figure 13:
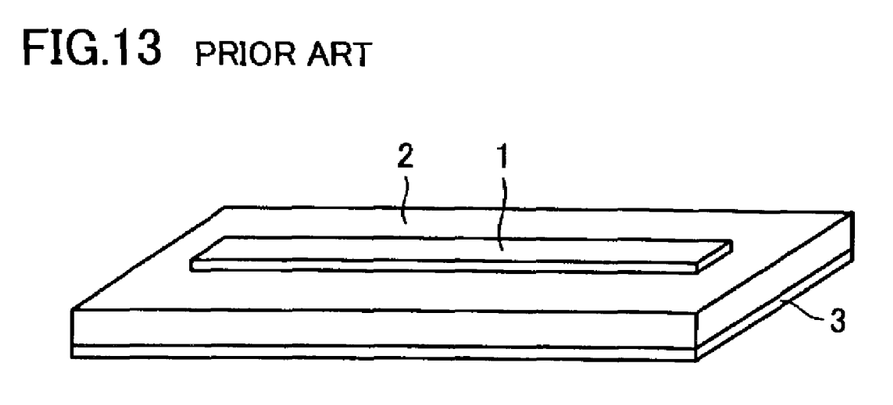
FIG. 13 is a perspective view of a conventional circuit board having a microstrip line.
Figure 14:
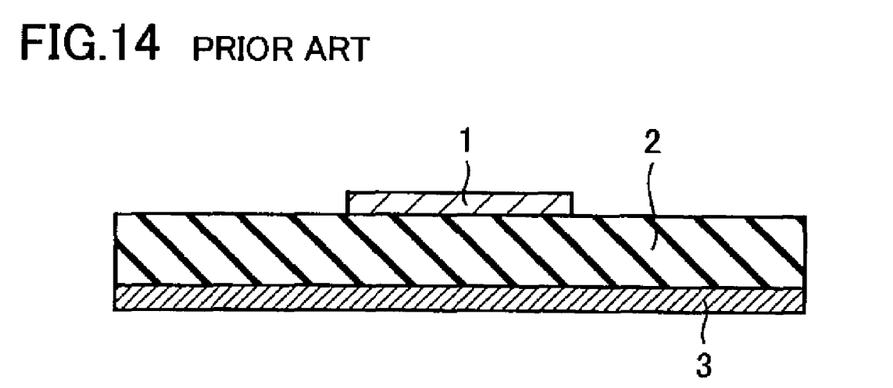
FIG. 14 is a cross sectional view of the circuit board shown in FIG. 13.

FIGS. 13 and 14 schematically show the microstrip substrate. As shown in FIGS. 13 and 14, the microstrip substrate has a substrate 2 of a dielectric material, a strip line 1 formed on a front surface of substrate 2, and a ground pattern 3 formed on a rear surface of substrate 2. Ground pattern 3 is generally formed of a metal layer covering the entire ground surface of the microstrip substrate. Herein, such a metal layer covering the entire surface is also referred to as a pattern. By comparison, a coplanar circuit generally has a ground pattern surrounding the periphery of a transmission line.

For example, when the microstrip substrate as described above is subjected to heat treatment for reflow or the like, substrate 2 suffers bowing due to a difference in area ratio (hereinafter, referred to as the "residual copper ratio") of the metal left on the front surface and the rear surface of substrate 2. The bowing of substrate 2 becomes greater as the difference in residual copper ratio between the front and rear surfaces of substrate 2 increases.

Generally, such bowing due to heat treatment is unlikely to occur with a hard substrate. On the contrary, a substrate formed of polytetrafluoroethylene and a soft substrate such as a so-called flexible substrate suffer considerable bowing, which greatly affects performance and quality of the circuit board.

Thus, various countermeasures have conventionally be taken to prevent the bowing, which include massaging the substrate before reflow, performing reflow at low temperature, and providing an additional step of calibrating the bowing.

Such countermeasures, however, cannot prevent bowing of the circuit board completely, causing falling off or misalignment of component(s) during reflow. Further, chip crack would occur when mounting the circuit board in an enclosure, possibly causing a serious problem regarding quality. Still further, the additional steps of massaging the substrate and others would lead to a considerable loss.

SUMMARY OF THE INVENTION

Based on the foregoing, an object of the present invention is to lessen bowing of a printed circuit board after heat treatment by adjusting a conductive pattern formed on a substrate, while preventing degradation in performance of a product and restricting a loss due to an additional step.

Another object of the present invention is to provide highly reliable, high-performance radio wave receiving converter and antenna device by incorporating the printed circuit board thereto.

According to an aspect of the present invention, the printed circuit board includes a substrate formed of an insulator, a first conductive pattern provided on the substrate, and a second conductive pattern provided on the substrate spaced apart from the first conductive pattern. The second conductive pattern is provided with an opening reaching the substrate. The "insulator" is defined to include a dielectric material, and the "substrate" is defined to include a flexible material in the form of film or the like.

Provision of the opening in the second conductive pattern to reach the substrate enables adjustment of residual copper ratio on a surface of the substrate on which the second conductive pattern is formed. Accordingly, the difference in residual copper ratio between the front surface and the rear surface of the substrate can be adjusted to alleviate thermal stress attributable to different thermal expansion coefficients of the substrate and the conductive pattern during heat treatment. As a result, it is possible to reduce bowing of the circuit board after the heat treatment.

The opening is for preventing the bowing of the circuit board after the heat treatment, which exposes the surface of the substrate. Exposed at this time may be a base material itself of the substrate, or a layer coating the substrate surface.

Preferably, the first conductive pattern is a transmission line, and the second conductive pattern is a ground pattern. That is, it is preferable to provide the opening in the ground pattern. By doing so, the bowing of the circuit board can be reduced without degrading the performance of the product.

The first conductive pattern may be a line pattern of microstrip lines. In this case, the maximum width of the opening is set not to exceed a guide wavelength. Thus, the bowing of the circuit board can be reduced while restricting a transmission loss.

The first conductive pattern may be formed on the front surface of the substrate, and the second conductive pattern may be formed on the rear surface thereof. In this case, a third conductive pattern to be a ground pattern may be provided on the front surface of the substrate, and the opening may be provided in the third conductive pattern. In this case, again, the difference in residual copper ratio between the front and rear surfaces of the substrate can be adjusted, whereby the bowing of the circuit board can be reduced.

The first conductive pattern may be a line pattern of coplanar lines. In this case, again, the maximum width of the opening is set not to exceed the guide wavelength. Thus, the bowing of the circuit board can be reduced, as in the case of the microstrip lines.

According to another aspect of the present invention, the printed circuit board includes a first substrate of an insulator, and a second substrate of an insulator having a different material from that of the first substrate, which is laminated on the first substrate with a conductive pattern interposed therebetween. A via hole is provided in the conductive pattern.

When the via hole is provided in the intermediate conductive layer between the substrates as described above, it is also possible to adjust the difference in residual copper ratio between the front and rear surfaces of the respective substrates by virtue of the via hole provided, and thus, it is possible to reduce the bowing of the circuit board after heat treatment. In addition, contact areas between the respective substrates and the conductive pattern can be reduced, and thus, stress due to swelling or shrinking of the substrates attributable to different thermal expansion coefficients of the substrates of different materials can be absorbed. This can also contribute to the reduction of bowing of the circuit board.

The via hole is for preventing the bowing of the circuit board after heat treatment, and reaches the surfaces of the first and second substrates. The via hole may stop at the first and second substrates; it does not need to penetrate them.

Preferably, the first substrate has a first transmission line, and the second substrate has a second transmission line. The conductive pattern is preferably a ground pattern.

The via hole may have a maximum width of not greater than a guide wavelength. In this case, the bowing of the circuit board can be reduced while restricting the transmission loss.

According to a further aspect of the present invention, the printed circuit board includes a substrate of an insulator having a through hole, and a conductive pattern provided on a surface of the substrate around the through hole. An opening is provided between the conductive pattern and the through hole to reach the substrate.

Generally, a conductive portion is formed in the through hole. At the time of heat treatment such as reflow, heat tends to accumulate at the conductive portion, which is transmitted to the conductive pattern formed on the substrate, thereby causing bowing of the substrate. Thus, the opening is provided between the conductive pattern and the through hole as described above, which can reduce the area of a path through which the heat accumulated at the conductive portion within the through hole during the heat treatment such as reflow is transmitted. Accordingly, thermal diffusion or heat conduction from the through hole to the conductive pattern during the heat treatment is restricted, so that bowing of the circuit board due to the thermal diffusion or heat conduction can be restricted.

Preferably, the opening is provided to surround the through hole. In this case, the through hole becomes independent from the conductive pattern, and thus, it is possible to effectively restrict the conduction of heat from the through hole to the conductive pattern.

A plurality of such openings may be provided around the through hole. The openings may be provided by patterning the conductive pattern. Alternatively, one or more conductive patterns may be formed to bridge the opening provided to surround the through hole, such that it looks as if there were a plurality of openings around the through hole.

When a plurality of such openings are provided around the through hole as described above, again, the area of the heat transmission path from the through hole to the conductive pattern can be reduced, and thus, it is possible to restrict the bowing of the circuit board attributable to the thermal diffusion or heat conduction from the through hole. Further, the conductive portion within the through hole may be grounded via the conductive pattern. It is useful in the case where the conductive portion in the through hole needs to be grounded.

The radio wave receiving converter according to the present invention is provided with the printed circuit board as described above. Further, the antenna device of the present invention is provided with the relevant radio wave receiving converter and a reflecting parabola portion for reflecting and guiding received radio waves to the radio wave receiving converter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to FIGS. 1-10.

First Embodiment

Figure 1:
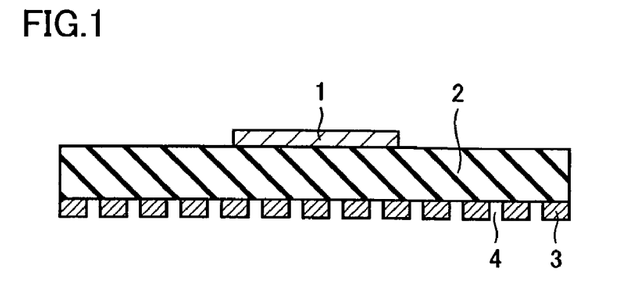
FIG. 1 is a schematic cross sectional view of a microstrip line portion of the printed circuit board according to a first embodiment of the present invention.
Figure 2:
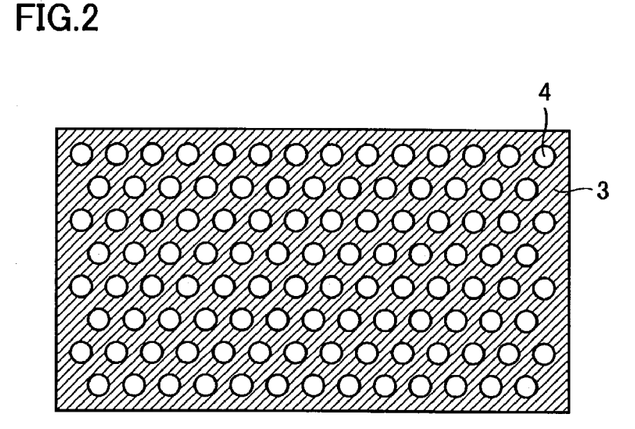
FIG. 2 shows a rear surface of the printed circuit board shown in FIG. 1.

FIG. 1 schematically shows the microstrip line portion of the printed circuit board according to the first embodiment. FIG. 2 shows the rear surface of the printed circuit board shown in FIG. 1.

As shown in FIGS. 1 and 2, the printed circuit board includes a substrate (base material) 2 of a dielectric material (insulator), a strip line (first conductive pattern) 1 as a transmission line formed on a front surface of substrate 2, and a ground metal layer (ground pattern) 3 formed to cover an entire rear surface of substrate 2.

Substrate 2 is formed of glass fiber and polytetrafluoroethylene, for example. Strip line 1 and ground metal layer 3 are formed, e.g., of copper. The copper surfaces may be coated with gold plating, solder plating, organic resin or the like to prevent corrosion.

A plurality of openings 4 are provided in ground metal layer 3. In the example shown in FIGS. 1 and 2, openings 4 are formed over the entire rear surface of substrate 2 at approximately equal distances from one another, and reach the surface of substrate 2 or a coating layer formed on the surface of substrate 2. Thus, the surface of substrate 2 or the coating layer formed on the surface of substrate 2 is exposed at the bottom of each opening 4. Openings 4 may be formed by etching, for example.

In forming the microstrip line, the transmission line is formed on one side of the substrate, and the ground metal layer is formed on the ground surface on the other side. Thus, the surfaces often exhibit metal area ratios (residual copper ratios) extremely different from each other. This creates considerable stress between the dielectric material (substrate 2) and the respective metal layers having different thermal expansion coefficients, thereby causing bowing of substrate 2.

Figure 5A:
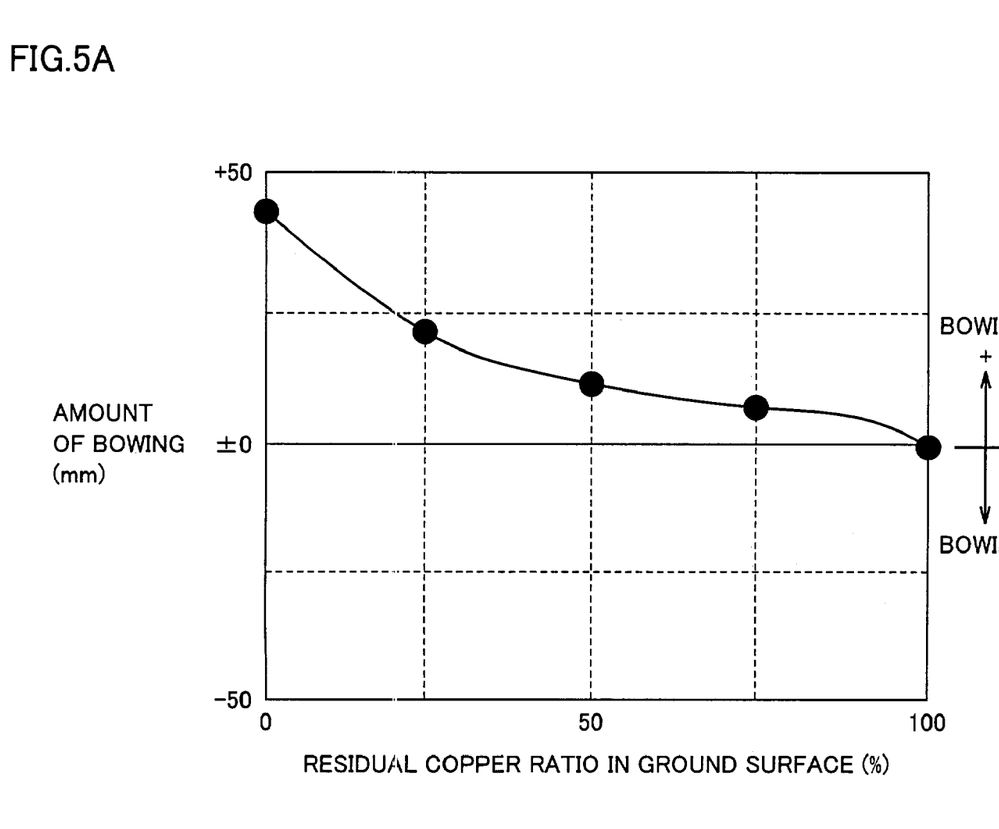
FIGS. 5A and 5B illustrate a relation between a residual copper ratio in the ground surface and an amount of bowing of the substrate.
Figure 5B:
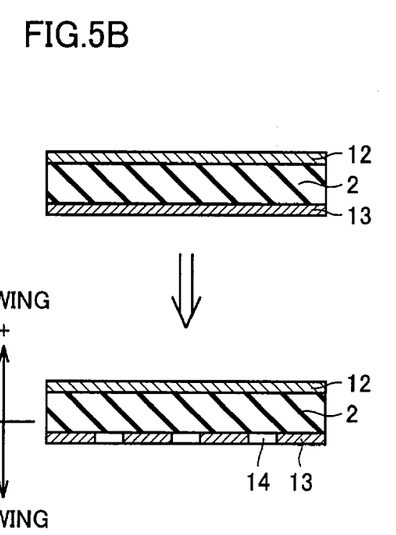

FIGS. 5A and 5B show the amount of bowing of substrate 2 in the case where relatively soft polytetrafluoroethylene is used as a material of substrate 2, Cu layers 12, 13 are formed on the entire surfaces on respective sides of substrate 2, and openings are formed in Cu layer 13 on the ground surface (on one side) to lower the residual copper ratio in the ground surface, which is then subjected to heat treatment at a temperature of not lower than 200° C. (e.g., on the order of 200-230° C.).

It is found from FIGS. 5A and 5B that substrate 2 suffers no bowing when the residual copper ratio in the ground surface is 100%, and the amount of bowing of substrate 2 increases as the residual copper ratio decreases. In particular, the amount of bowing of substrate 2 becomes greatest with the residual copper ratio in a range of 0-25%.

Figure 6A:
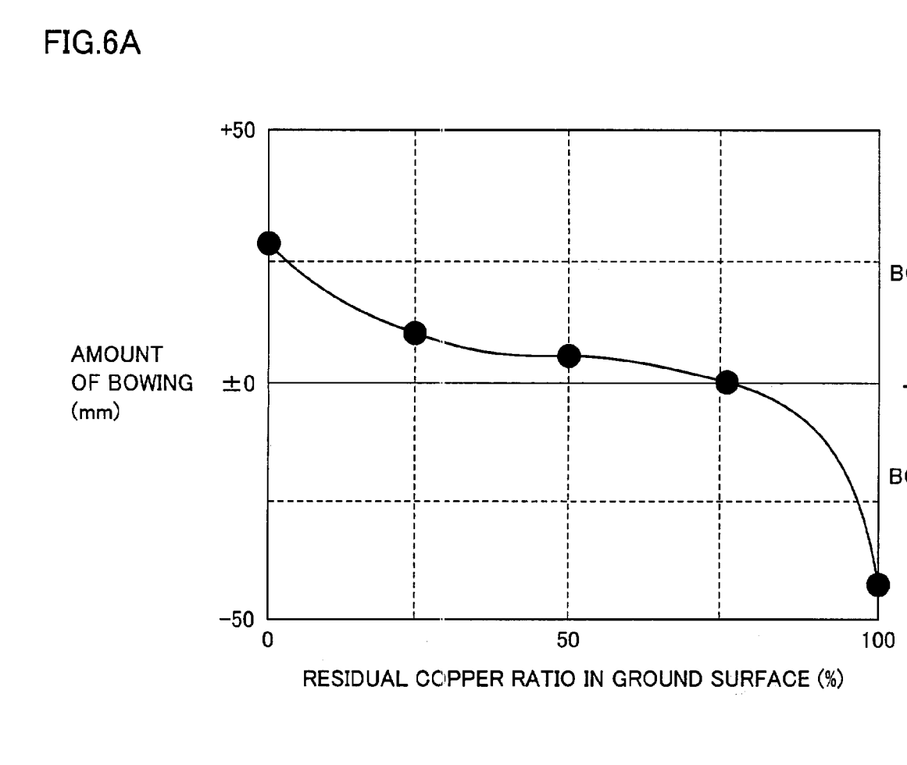
FIGS. 6A and 6B illustrate a relation between the residual copper ratio in the ground surface and the amount of bowing of the substrate when a pattern is actually formed.
Figure 6B:
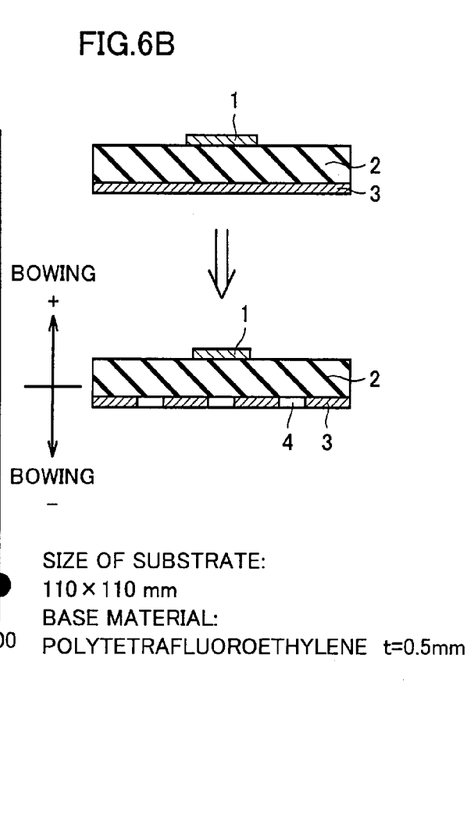

Next, results of a bowing test when the concept of the first embodiment is adapted to an actual printed circuit board having a microstrip line are shown in FIGS. 6A and 6B.

In this test, a printed circuit board having substrate 2 formed of polytetrafluoroethylene to a thickness of 0.5 mm and a size of 110×110 mm is employed. Various wiring patterns and electronic components are mounted on the printed circuit board. Openings 4 are provided in the ground metal layer 3 of the printed circuit board to adjust the residual copper ratio of the ground surface. The substrates having different residual copper ratios are subjected to heat treatment as in FIGS. 5A and 5B, and the amounts of bowing of the respective substrates are measured.

As shown in FIGS. 6A and 6B, an optimal point in this example corresponds to a residual copper ratio near 75%, and the amount of bowing of substrate 2 is small with the residual copper ratio of about 70-80%. It means that the amount of bowing of substrate 2 can be reduced by providing ground metal layer 3 with openings 4 according to the present invention.

An optimal residual copper ratio varies according to a kind and/or a thermal expansion coefficient of substrate 2, a wiring pattern provided on the surface of substrate 2, hardness, thickness and size of substrate 2, and others. Thus, it is necessary to determine the optimal residual copper ratio individually in each case through actual experiments.

Microstrip lines have characteristics which vary due to conditions of the ground surface. Thus, removal of a copper layer at random may lead to considerable degradation of the characteristics. As such, specific considerations as follows will be required when the present invention is to be applied to a high-frequency circuit board.

The shape and size of opening 4 should be selected in accordance with an operating frequency. More specifically, the maximum width of opening 4 is set not greater than a guide wavelength $\lambda g$ of a waveguide in which a microstrip line is placed. This can restrict the degradation in characteristics of the microstrip line. In the example shown in FIG. 3 where opening 4 has a circular shape, the diameter of opening 4 is made not greater than guide wavelength $\lambda g$. Alternatively, the diameter of opening 4 may be set not to exceed $\lambda g/4$.

The way of designing opening 4 is now explained. Here, the designing method of circular opening 4 is described by way of example.

Figure 3:
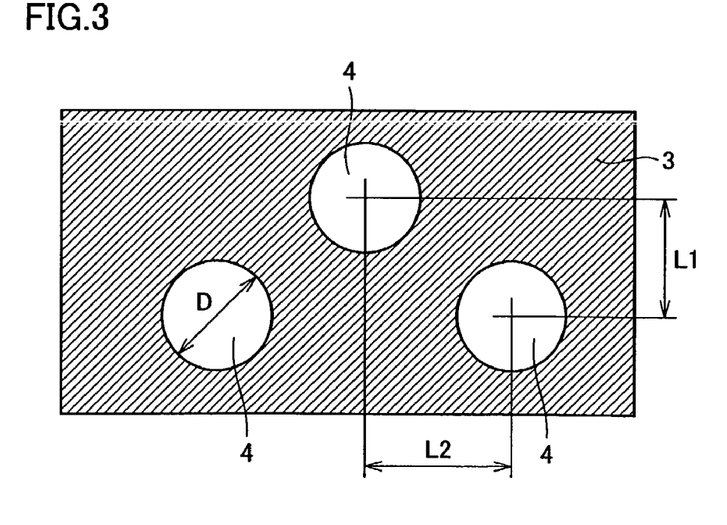
FIG. 3 is a partial enlarged view of the openings shown in FIG. 2.

A diameter Rg (D in FIG. 3) of opening 4 (circular aperture) is expressed by the following expression (1):

$$Rg = \lambda g/4 \quad (1)$$

where $\in$ represents a dielectric constant of substrate 2, and $\lambda g$ represents a guide wavelength.

The expression (1) becomes the following expression (2) when the wavelength in substrate 2 is $\lambda$.

$$Rg = (\lambda/4) \times (1/\sqrt{\in}) \quad (2)$$

By setting the diameter Rg of opening 4 according to the above expressions (1) and (2), performance degradation of the microstrip line can be prevented.

One way of arranging openings 4 is now explained.

As shown in FIG. 3, a diameter D of opening 4 is obtained from the above expression (1), and positions of openings 4 for a certain residual copper ratio are determined. For example, $L1 \times L2 = 2Rg\sqrt{3}$ when the residual copper ratio is 75%.

Second Embodiment

Figure 4:
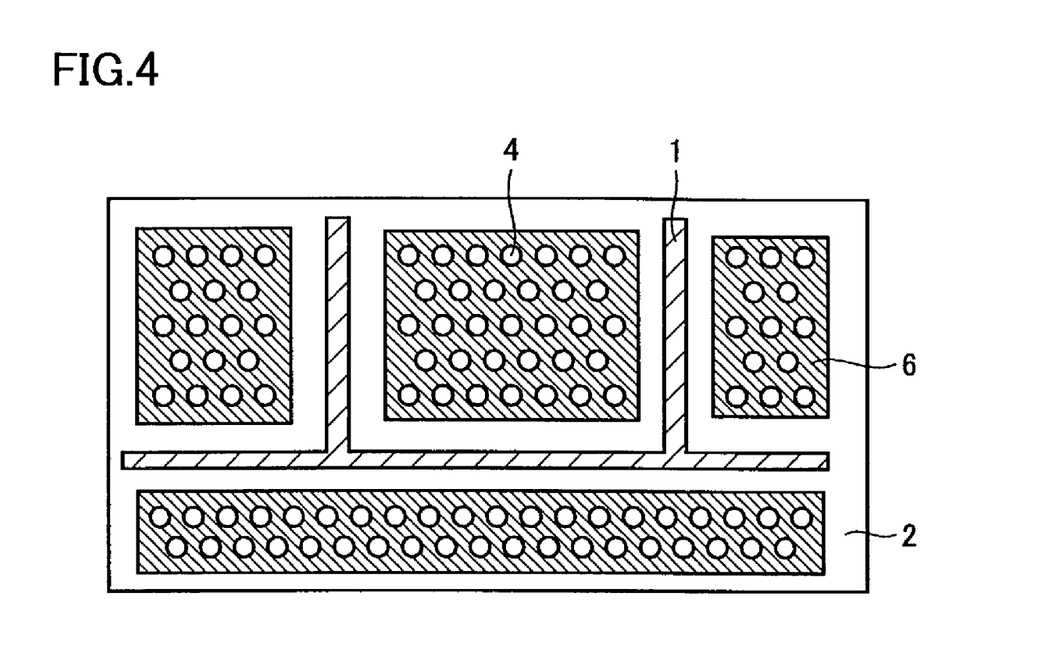
FIG. 4 is a partial top plan view of the printed circuit board according to a second embodiment of the present invention.

The second embodiment of the present invention is explained with reference to FIG. 4. FIG. 4 is a partial top plan view of the printed circuit board of the second embodiment.

As shown in FIG. 4, a ground pattern 6 may be provided on a microstrip line surface of substrate 2 on which a strip line 1 is formed, and openings 4 may be provided in the relevant ground pattern 6. In this case, again, the residual copper ratio can be adjusted, and thus, the bowing of the circuit board can be reduced. The shape and designing method of opening 4 are as in the first embodiment.

Third Embodiment

Figure 7:
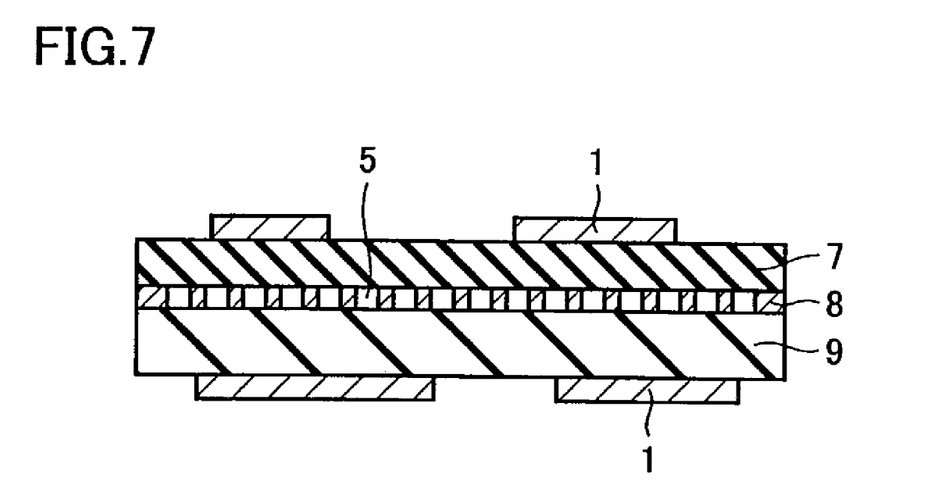
FIG. 7 is a partial cross sectional view of the printed circuit board according to a third embodiment of the present invention.

The third embodiment of the present invention is explained with reference to FIG. 7. FIG. 7 is a partial cross sectional view of the printed circuit board of the third embodiment. In the third embodiment, the present invention is applied to a printed circuit board having laminated substrates.

As shown in FIG. 7, the printed circuit board has substrates 7, 9 formed of different materials, an intermediate layer 8 formed between substrates 7 and 9, and strip lines (transmission lines) 1 formed on surfaces of respective substrates 7, 9.

Substrate 7 is formed, e.g., of FR-4, and substrate 9 is formed, e.g., of polytetrafluoroethylene. Intermediate layer 8 is formed of a metal layer such as copper.

In the third embodiment, via holes 5 reaching respective substrates 7, 9 are formed in intermediate layer 8. Provision of such via holes 5 restricts occurrence of internal stress due to the difference in thermal expansion coefficient of the different materials during the heat treatment, and thus contributes to reduction of bowing of the circuit board.

The maximum width of via hole 5 is also set not greater than a guide wavelength $\lambda g$ of a waveguide in which the transmission line is placed. This suppresses degradation in characteristics of the transmission line. Via hole 5 may have a circular opening shape. In this case, a diameter of the opening of via hole 5 is set not greater than guide wavelength $\lambda g$. The diameter of the opening may be set not greater than $\lambda g/4$.

Although the via hole 5 of the present embodiment can be designed in the same manner as in the first embodiment, the diameter of the opening of via hole 5 should be determined by choosing the greater one of dielectric constants $\epsilon$ of substrates 7 and 9 when calculating the same. Further, when at least two kinds of frequencies are being employed, the calculation should be made based on the greater or greatest one of them.

Fourth Embodiment

Figure 8:
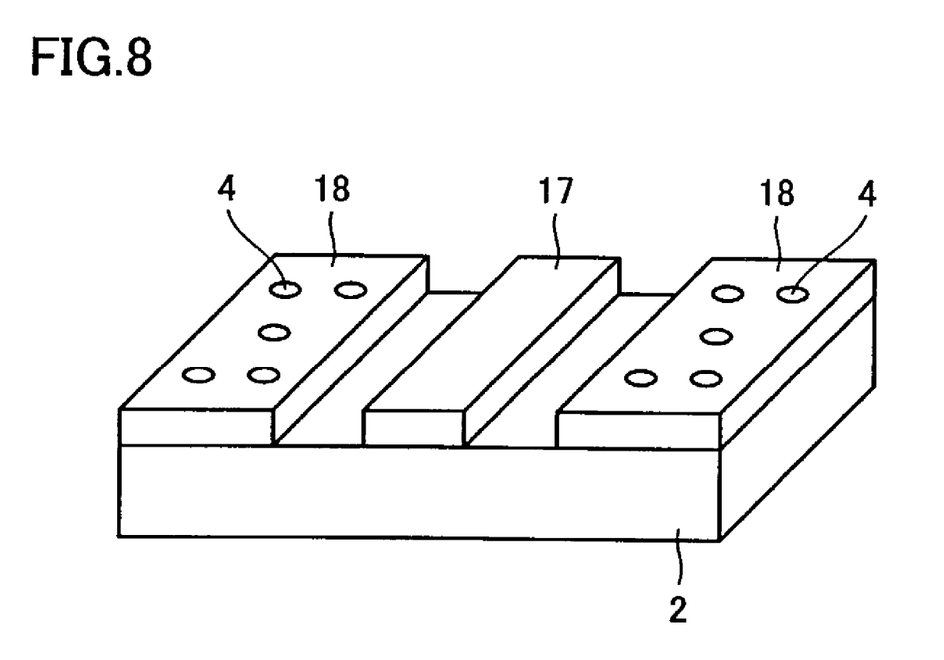
FIG. 8 is a partial perspective view of the printed circuit board according to a fourth embodiment of the present invention.

The fourth embodiment of the present invention is now explained with reference to FIG. 8. FIG. 8 is a partial cross sectional perspective view of the printed circuit board of the fourth embodiment.

In the fourth embodiment, the present invention is applied to a coplanar line portion of the printed circuit board.

As shown in FIG. 8, the printed circuit board of the fourth embodiment is provided with a line pattern (signal line) 17 and a ground pattern 18 on the same surface of substrate 2. Openings 4 are provided in ground pattern 18. Accordingly, the residual copper ratio in the line surface of substrate 2 can be adjusted, and thus, the bowing of the circuit board after heat treatment can be reduced.

Fifth Embodiment

Figure 9:
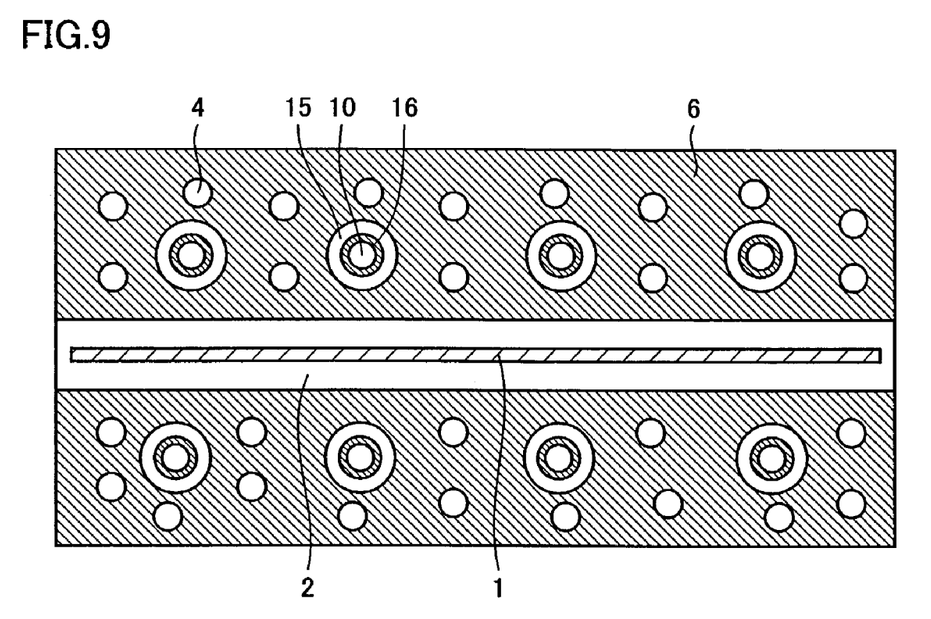
FIG. 9 is a partial top plan view of the printed circuit board according to a fifth embodiment of the present invention.

The fifth embodiment and a modification thereof are explained with reference to FIGS. 9 and 10. FIG. 9 is a partial top plan view of the printed circuit board of the fifth embodiment. In the fifth embodiment, the present invention is applied to a printed circuit board having a through hole.

In a high-frequency circuit, a through hole 10 is generally employed to electrically connect a transmission surface with a ground surface on the rear side. Through hole 10 has its inner surface covered with a metal layer (conductive portion) 16 formed of plating or the like, and thus, through hole 10 has a thermal conductivity greater than that of the surrounding dielectric material. This disturbs thermal distribution across the entire substrate 2, and substrate 2 is likely to bow in an area where through holes 10 are provided collectively.

Thus, an opening 15 is provided between through hole 10 and a ground pattern (conductive pattern) 6 around through hole 10. This can reduce an area of a path through which heat accumulated at metal layer 16 in through hole 10 during heat treatment such as reflow is transmitted to ground pattern 6. As a result, thermal diffusion or heat conduction from through hole 10 to ground pattern 6 during the heat treatment can be restricted, and thus, bowing of substrate 2 attributable to such thermal diffusion or heat conduction can be restricted.

In particular, as shown in FIG. 9, opening 15 provided to surround through hole 10 separates through hole 10 from ground pattern 6. That is, through hole 10 becomes independent from the conductive pattern on the substrate surface. As such, thermal diffusion or heat conduction from through hole 10 to the substrate surface can be alleviated, and accordingly, bowing of substrate 2 due to localization of heat can be reduced.

Figure 10:
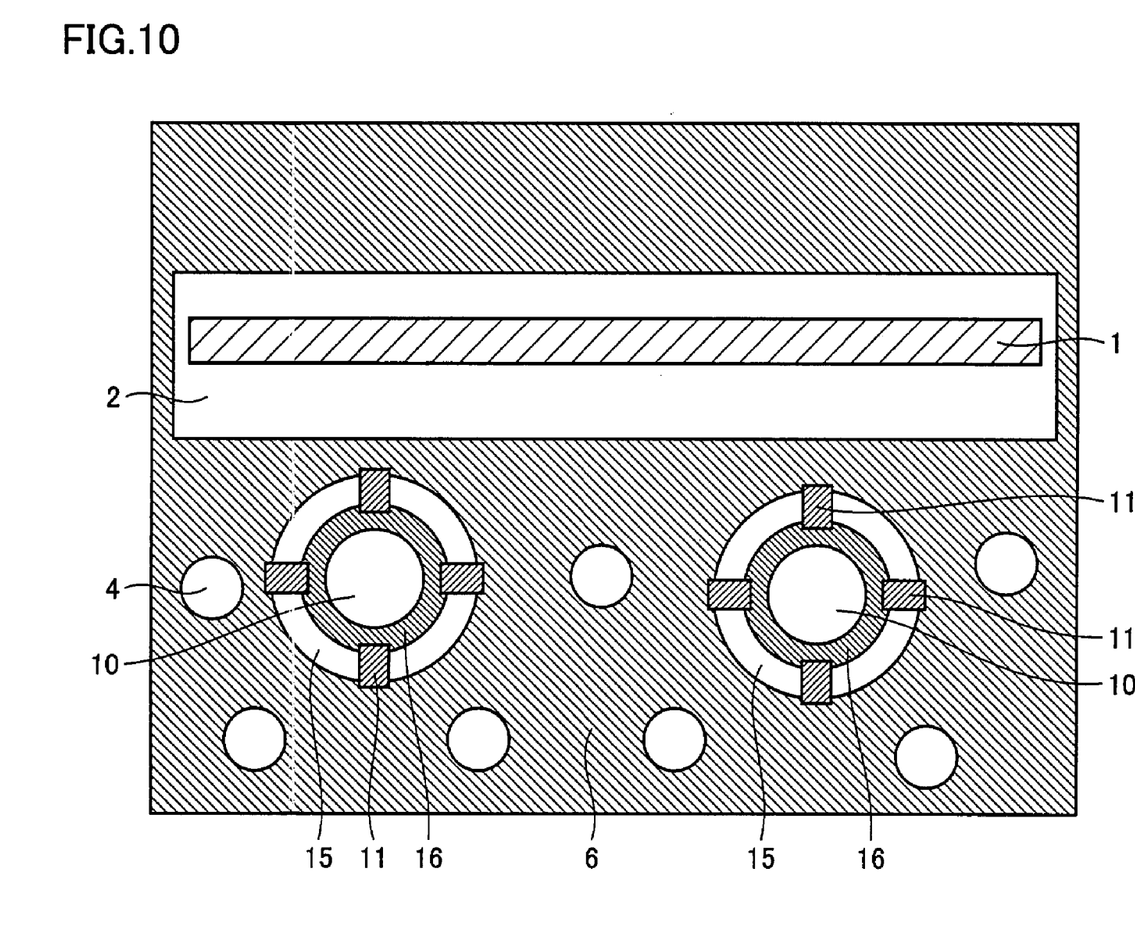
FIG. 10 is a partial top plan view of a modification of the embodiment shown in FIG. 9.

If it is necessary to electrically connect through hole 10 with ground pattern 6, a narrow connect pattern 11 of small heat capacity may be provided to connect metal layer 16 within through hole 10 and ground pattern 6, as shown in FIG. 10. By doing so, a path through which heat is transmitted from through hole 10 to ground pattern 6 can be made small, and hence, heat conduction from through hole 10 to the substrate surface can be made small.

The connect pattern 11 may be formed of a metal pattern of copper, for example. Although four connect patterns 11 are provided in the example shown in FIG. 10, connect pattern 11 may be provided in any number including one.

In the example shown in FIG. 10, connect patterns 11 are provided to bridge opening 15. As a result, it looks as if a plurality of openings were provided around through hole 10.

It is also conceivable that ground pattern 6 is patterned by etching or the like to provide a plurality of openings around through hole 10. In this case, again, heat conduction from through hole 10 to the substrate surface can be made small as in the case described above.

Although the case of applying the present invention to a high-frequency circuit board has been described in the above embodiments, the present invention is applicable to printed circuit boards other than the same. In other words, the present invention encompasses any case where a conductive pattern formed on a substrate surface is selectively removed to prevent bowing of the circuit board after heat treatment.

When the present invention is applied to a high-frequency circuit board, the shape and size of the openings and others will have considerable electric effects as described above. Thus, it is necessary to select appropriate shape and size of the openings and others in accordance with the designing method as described above. By comparison, there are no such constraints as in the case of the high-frequency circuit board when the present invention is applied to any circuit board other than the same. All that is needed in such a case is to selectively remove the conductive pattern to provide opening, via hole, slit or cut in an arbitrary shape, to the extent that the circuit characteristics are not degraded.

Sixth Embodiment

A radio wave receiving converter, or LNB (Low Noise Block down converter), and an antenna device each incorporating the high-frequency circuit board to which the present invention has been applied, are now explained with reference to FIGS. 11 and 12.

Figure 11:
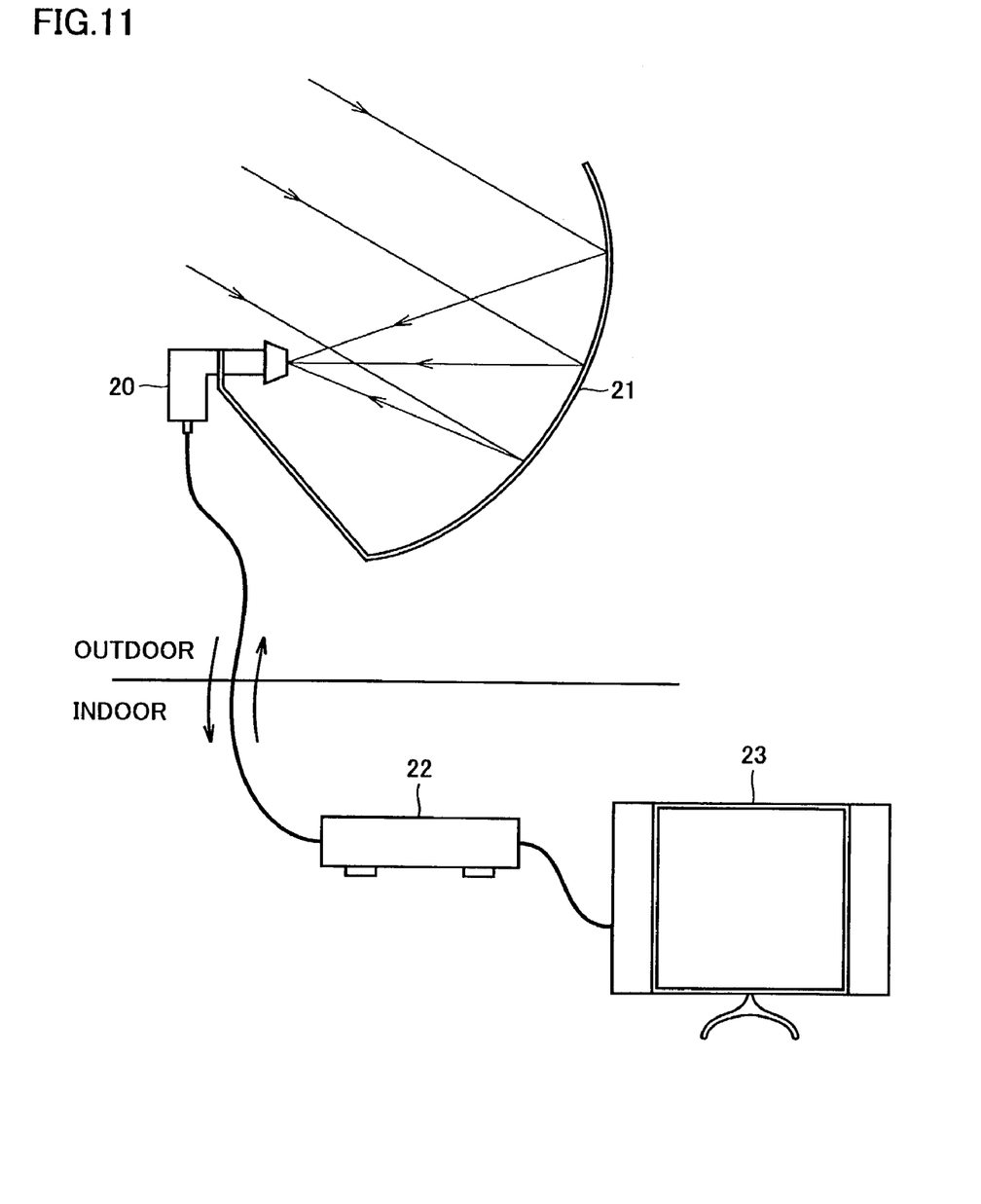
FIG. 11 is a conceptual diagram illustrating a radio wave receiving converter and an antenna device according to the present invention.

As shown in FIG. 11, radio waves (signals) from the satellite are reflected and collected by a reflecting parabola portion 21 and guided to and taken into radio wave receiving converter 20. The reflecting parabola portion 21 and radio wave receiving converter 20 constitute the antenna device.

The radio waves from the satellite are circularly polarized waves including right-hand and left-hand polarized waves. Radio wave receiving converter 20 separates the radio waves into these two components and amplifies them to convert the radio waves of ten-odd GHz band to signals of one GHz band. The converted signals are sent via a cable to indoor receiving equipment, e.g., to a television set 23 via a satellite receiver 22.

Figure 12:
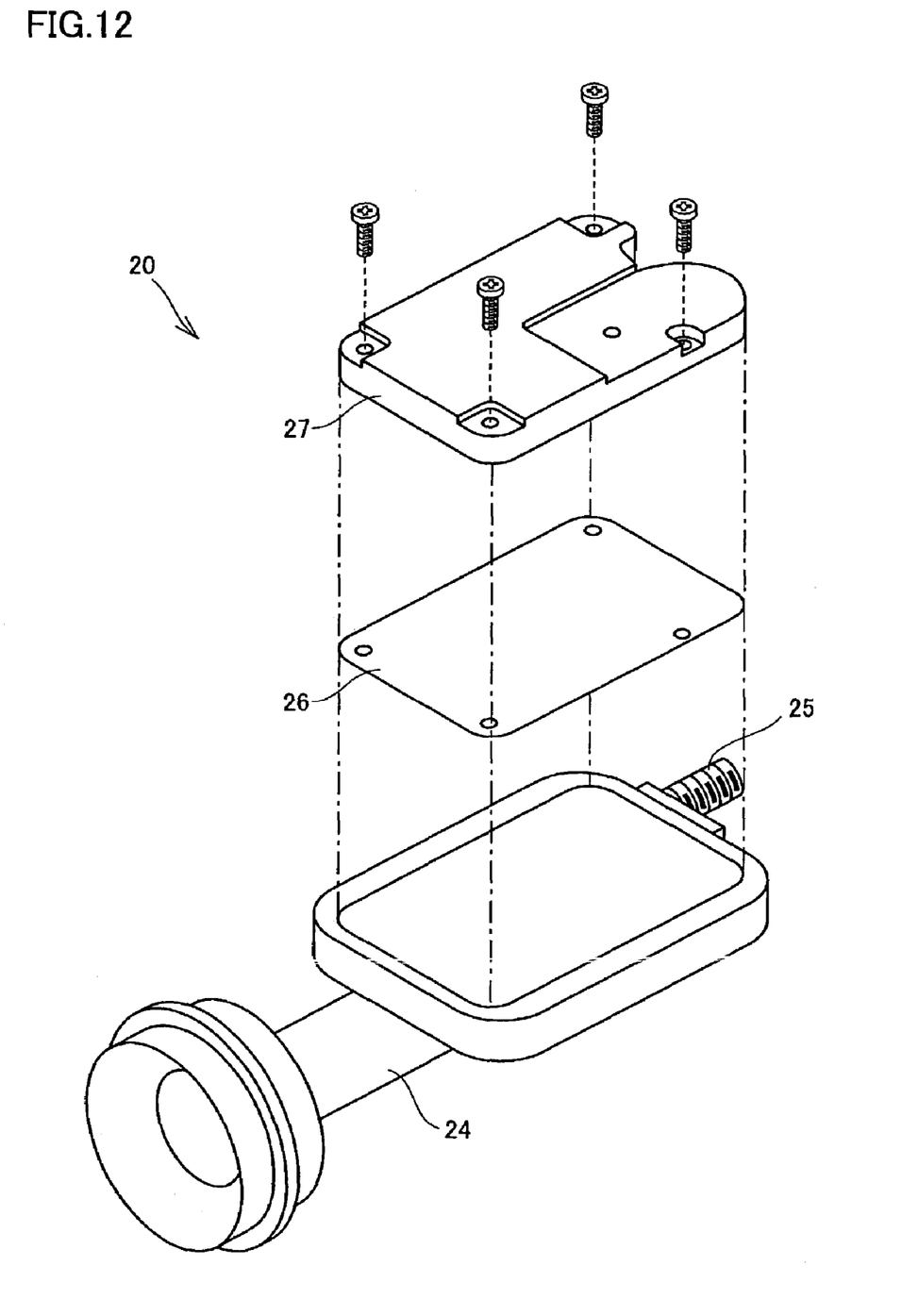
FIG. 12 is an exploded perspective view of the radio wave receiving converter of the present invention.

As shown in FIG. 12, radio wave receiving converter 20 described above is provided with a metal chassis 24 having an output terminal (F-type connector) 25, a high-frequency circuit board 26, and a metal frame 27 mounted to chassis 24. The printed circuit board of the present invention is employed as the high-frequency circuit board 26 incorporated into the radio wave receiving converter 20.

With frame 27 secured to chassis 24 by screws, the chassis 24 and the frame 27 constitute an enclosure of radio wave receiving converter 20, into which the high-frequency circuit board 26 of the present invention is incorporated.

As described above, according to the embodiments of the present invention, bowing of a printed circuit board after heat treatment can be reduced. The inventors found that, when an opening was actually provided in a conductive pattern of a high-frequency circuit board, prior to heat treatment, to achieve a residual copper ratio of 70-80% in the ground surface on the rear side of a substrate, the bowing of the circuit board after heat treatment was reduced to one-fifth to one-tenth of that in the conventional case. Since the bowing of the circuit board can be reduced, displacement or dropping of component(s) due to the bowing of the circuit board can be suppressed, and thus, reliability of the circuit board improves. Further, reliability of the product after incorporated into an enclosure also improves. In addition, openings and via holes of the present invention can readily be formed by etching or the like. Thus, compared to the case where massaging of the substrate or the like is required, the loss due to the additional step(s) can be kept low.

The radio wave receiving converter and the antenna device of the present invention are provided with the printed circuit board as described above, and thus, they become highly reliable and ensure high performance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A printed circuit board, comprising:
   a substrate formed of an insulator;
   a first conductive pattern provided on said substrate; and
   a second conductive pattern provided on said substrate, spaced apart from said first conductive pattern; wherein
   a blind opening having a closed periphery and a maximum width of not greater than a guide wavelength is provided in said second conductive pattern to reach said substrate,
   said first conductive pattern is a transmission line,
   said second conductive pattern is a ground pattern,
   said first conductive pattern is formed on a front surface of said substrate and said second conductive pattern is formed on a rear surface of said substrate, and
   a third conductive pattern to be a ground pattern is provided on the front surface of said substrate, and said opening is provided in the third conductive pattern.

2. The printed circuit board according to claim 1, wherein said first conductive pattern is a line pattern of a microstrip line.

3. The printed circuit board according to claim 1, wherein said first conductive pattern is a line pattern of a coplanar line.

4. A radio wave receiving converter, provided with the printed circuit board according to claim 1.

5. An antenna device, provided with the radio wave receiving converter according to claim 4 and a reflecting parabola portion for reflecting and guiding received radio waves to said radio wave receiving converter.

6. A printed circuit board, comprising:
   a first substrate formed of an insulator and including a first transmission line; and
   a second substrate formed of an insulator that is a different material from that of said first substrate and having a second transmission line, said second substrate being laminated on said first substrate with a conductive pattern interposed therebetween, said conductive pattern comprising a ground pattern for said first transmission line and said second transmission line; wherein
   a via hole having a first end and a second end is provided in said conductive pattern, said first end being closed by said first substrate and said second end being closed by said second substrate.

7. The printed circuit board according to claim 6, wherein said via hole is for preventing bowing of said substrate after heat treatment, and said via hole reaches surfaces of said first and second substrates.

8. The printed circuit board according to claim 6, wherein said via hole has a maximum width of not greater than a guide wavelength.

9. A radio wave receiving converter, provided with the printed circuit board according to claim 6.

10. An antenna device, provided with the radio wave receiving converter according to claim 9 and a reflecting parabola portion for reflecting and guiding received radio waves to said radio wave receiving converter.

11. A printed circuit board, comprising:
    a substrate formed of an insulator and having a through hole area and a through hole in the through hole area; and
    a conductive pattern provided on a surface of said substrate around said through hole area; wherein
    a plurality of conductive strips extend across said through hole area, spaced from said insulator, to connect said conductive pattern to said through hole while exposing portions of said surface of said substrate in the through hole area.

12. A radio wave receiving converter, provided with the printed circuit board according to claim 11.

13. An antenna device, provided with the radio wave receiving converter according to claim 12 and a reflecting parabola portion for reflecting and guiding received radio waves to said radio wave receiving converter.

* * * * *